(12) United States Patent  (10) Patent No.: US 8,129,778 B2
Kim et al.  (45) Date of Patent: Mar. 6, 2012

(54) SEMICONDUCTOR DEVICES AND METHODS FOR MAKING THE SAME

(75) Inventors: Suku Kim, South Jordan, UT (US); James J. Murphy, South Jordan, UT (US); Gary Dolny, Mountain Top, PA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 289 days.

(21) Appl. No.: 12/629,232

(22) Filed: Dec. 2, 2009

(65) Prior Publication Data

US 2011/0127601 A1 Jun. 2, 2011

(51) Int. Cl.
*H01L 21/00* (2006.01)

(52) U.S. Cl. ........ 257/331; 257/290; 257/329; 257/335; 257/361; 257/E21.149; 257/E21.551; 257/E27.159; 257/E29.257; 257/E29.346

(58) Field of Classification Search .......... 257/229–241, 257/290, 329–361, E21, 149, 551, 27.159, 257/29.257

See application file for complete search history.

(56) References Cited

U.S. PATENT DOCUMENTS

| | | | | |
|---|---|---|---|---|
| 4,348,690 A * | 9/1982 | Jastrzebski et al. | ........... | 348/282 |
| 4,666,557 A * | 5/1987 | Collins et al. | ................. | 438/434 |
| 4,713,358 A | 12/1987 | Bulat et al. | | |
| 5,034,338 A * | 7/1991 | Neppl et al. | .................. | 438/207 |
| 5,250,461 A * | 10/1993 | Sparks | .......................... | 438/429 |
| 5,250,837 A * | 10/1993 | Sparks | .......................... | 257/519 |
| 5,352,915 A * | 10/1994 | Hutchings et al. | ............ | 257/361 |
| 5,583,348 A * | 12/1996 | Sundaram | ....................... | 257/73 |
| 5,689,128 A * | 11/1997 | Hshieh et al. | ................. | 257/331 |
| 5,753,938 A * | 5/1998 | Thapar et al. | ................... | 257/77 |
| 5,770,484 A * | 6/1998 | Kleinhenz | ...................... | 438/155 |
| 6,057,184 A * | 5/2000 | Brown et al. | ................. | 438/199 |
| 6,090,661 A * | 7/2000 | Perng et al. | .................... | 438/248 |
| 6,228,698 B1 * | 5/2001 | Luo | ............................... | 438/234 |
| 6,285,060 B1 * | 9/2001 | Korec et al. | .................... | 257/342 |
| 6,291,298 B1 * | 9/2001 | Williams et al. | .............. | 438/270 |
| 6,677,641 B2 | 1/2004 | Kocon | | |
| 6,710,418 B1 * | 3/2004 | Sapp | ............................. | 257/471 |
| 6,803,626 B2 | 10/2004 | Sapp et al. | | |
| 6,818,513 B2 | 11/2004 | Marchant | | |
| 6,878,993 B2 * | 4/2005 | Yilmaz | ......................... | 257/330 |
| 6,987,052 B2 * | 1/2006 | Baiocchi et al. | .............. | 438/343 |
| 7,026,668 B2 | 4/2006 | Hatakeyama et al. | | |
| 7,052,982 B2 | 5/2006 | Hshieh et al. | | |
| 7,319,256 B1 | 1/2008 | Kraft et al. | | |
| 7,323,386 B2 * | 1/2008 | Yilmaz | ......................... | 438/268 |
| 7,332,398 B2 * | 2/2008 | In't Zandt et al. | ............ | 438/270 |
| 7,345,342 B2 | 3/2008 | Challa et al. | | |
| 7,368,777 B2 | 5/2008 | Kocon | | |
| 7,393,749 B2 | 7/2008 | Yilmaz et al. | | |
| 7,394,144 B2 * | 7/2008 | Rochefort et al. | ............ | 257/522 |
| 7,910,486 B2 * | 3/2011 | Yilmaz et al. | ................. | 438/700 |
| 2005/0167744 A1 * | 8/2005 | Yilmaz | ......................... | 257/329 |
| 2007/0131987 A1 * | 6/2007 | Kim | ............................. | 257/290 |
| 2008/0111207 A1 | 5/2008 | Lee et al. | | |
| 2008/0138954 A1 | 6/2008 | Cai | | |
| 2009/0191678 A1 * | 7/2009 | Yilmaz et al. | ................. | 438/270 |
| 2011/0198689 A1 * | 8/2011 | Kim | .............................. | 257/331 |

* cited by examiner

*Primary Examiner* — Michael Lebentritt

(74) *Attorney, Agent, or Firm* — Kirton & McConkie; Kenneth E. Horton (57) ABSTRACT

Semiconductor devices and methods for making such devices that are especially suited for high-frequency applications are described. The semiconductor devices combine a SIT (or a junction field-effect transistor [JFET]) architecture with a PN super-junction structure. The SIT architecture can be made using a trench formation containing a gate that is sandwiched between thick dielectric layers. While the gate is vertically sandwiched between the two isolating regions in the trench, it is also connected to a region of one conductivity type of the super-junction structure, thereby allowing control of the current path of the semiconductor device. Such semiconductor devices have a lower specific resistance and capacitance relative to conventional planar gate and recessed gate SIT semiconductor devices. Other embodiments are described.

20 Claims, 5 Drawing Sheets

SEMICONDUCTOR DEVICES AND METHODS FOR MAKING THE SAME

FIELD

This application relates generally to semiconductor devices and methods for making such devices. More specifically, this application describes semiconductor devices and methods for making such devices that are especially suited for high-frequency applications.

BACKGROUND

Semiconductor devices containing integrated circuits (ICs) or discrete devices are used in a wide variety of electronic apparatus. The IC devices (or chips, or discrete devices) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including imaging, deposition, etching, doping and cleaning. Silicon wafers are typically used as the substrate and photolithography is used to mark different areas of the substrate to be doped or to deposit and define polysilicon, insulators, or metal layers.

Static induction transistors (SIT) are devices that have been used typically for, but not limited to, high voltage and ultra high frequency applications. Some SIT devices are normally "on" semiconductor devices since the gate voltage (Vg) is normally equal to 0. The reverse bias that can be applied to the gate can expand the depletion region and pinch-off and block the current flow (e.g., the device turns off at Vg of −15V).

Figure 10:
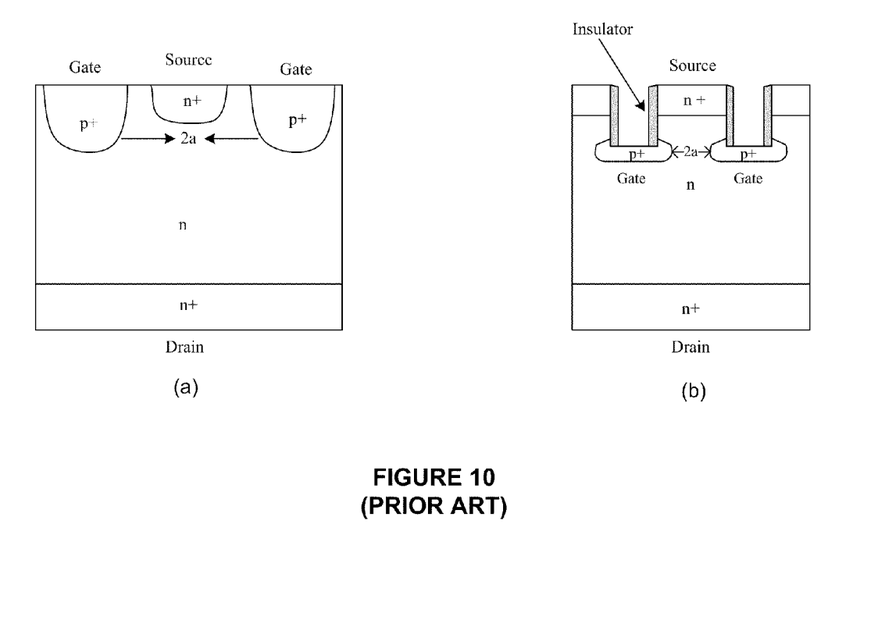

Two examples of conventional SIT devices are depicted in FIGS. 10(a) and 8(b). The device depicted in FIG. 10(a) is often referred to as a planar gate SIT and can have a relatively low capacitance but a relatively high specific resistance ($R_{sp}$). The planar gate structure is used for higher frequency applications due to its lower capacitance. The device depicted in FIG. 10(b) is often referred to as a recessed gate SIT and can have relatively high capacitance but a relatively low $R_{sp}$. While the recessed gate structure can have a lower $R_{sp}$, it can be limited by large parasitic capacitance from the dielectric on the side wall of the trench.

SUMMARY

This application describes semiconductor devices and methods for making such devices that are especially suited for, but are not limited to, high-frequency applications. The semiconductor devices combine a SIT (or a junction field-effect transistor [JFET]) architecture with a PN super-junction structure. The SIT architecture can be made using a trench formation containing a gate that is sandwiched between thick dielectric layers. While the gate is vertically sandwiched between the two isolating regions in the trench, it is also connected to a region of one conductivity type of the super-junction structure, thereby allowing control of the current path of the semiconductor device. Such semiconductor devices have a lower specific resistance and capacitance relative to conventional planar gate and recessed gate SIT semiconductor devices.

BRIEF DESCRIPTION OF THE DRAWINGS

The following description can be better understood in light of the Figures, in which:

FIGS. 10(a) and (b) shows two conventional SIT semiconductor devices.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while description refers to trench SIT devices, it could be modified for other devices formed in trenches, such as JFET devices, or any other SIT and JFET family devices. As another example, while the description refers to planar or recessed gate SIT devices, it could be modified for other static induction family devices, such as static induction thyristors, Static Induction Diode (SID), Static Induction Thyristor, Lateral Punch-Through Transistor (LPTT), Static Induction Transistor Logic (SITL), Static Induction MOS Transistor (SIMOS), Space Charge Limiting Load (SCLL), and the bipolar mode devices of all these devices (e.g. Bipolar Static Induction Transistor, Bipolar Static Induction Thyristor. As well, although the devices of the invention are described with reference to a particular type of conductivity (P or N), the devices can be configured with a combination of the same type of dopant or can be configured with the opposite type of conductivity (N or P, respectively) by appropriate modifications.

Figure 1:
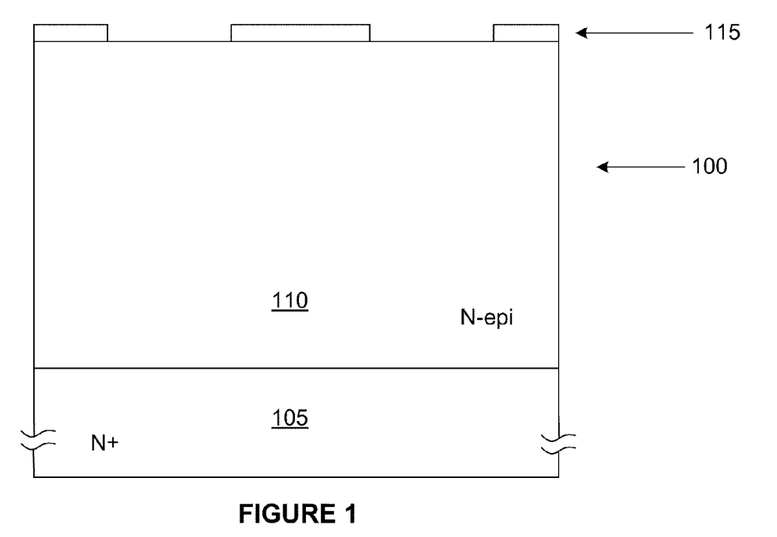
FIG. 1 shows some embodiments of methods for making a semiconductor structure containing a substrate and an epitaxial (or "epi") layer with a mask on the upper surface of the epitaxial layer.

Some embodiments of the semiconductor devices and methods for making such device are shown in FIGS. 1-7. The methods begin in some embodiments, as depicted in FIG. 1, when a semiconductor substrate 105 is first provided. Any substrate known in the art can be used in the invention. Suitable substrates include silicon wafers, epitaxial Si layers, bonded wafers such as used in silicon-on-insulator (SOI) technologies, and/or amorphous silicon layers, all of which may be doped or undoped. Also, any other semiconducting material used for electronic devices can be used, including Ge, SiGe, SiC, GaN, GaAs, $In_xGa_yAs_z$, $Al_xGa_yAs_z$, and/or any pure or compound semiconductors, such as III-V or II-VIs and their variants. In some embodiments, the substrate 105 can be heavily doped with any n-type dopant.

In some embodiments, the substrate 105 contains one or more epitaxial ("epi") Si layers (individually or collectively depicted as epitaxial layer 110) located on an upper surface thereof. The epitaxial layer(s) 110 can be provided using any known process in the art, including any known epitaxial deposition process. The epitaxial layer(s) can be lightly doped with an n-type dopant.

In some configurations, the dopant concentration within the epitaxial layer 110 is not uniform. In particular, the epitaxial layer 110 can have a higher dopant concentration in the upper portion and a lower dopant concentration in the lower portion. In some embodiments, the epitaxial layer can have a concentration gradient throughout its depth with the highest concentration near or at the upper surface and the lower concentration near or at the interface with the substrate, or vice versa 105. The concentration gradient along the length can be a consistent decrease, a step-wise decrease, or a combination thereof.

In some configurations to obtain this concentration gradient, multiple epitaxial layers can be provided on the substrate 105 and each epitaxial layer contains a different dopant concentration. The number of epitaxial layers can range from 2 to as many as needed. In these configurations, each successive epitaxial layer is deposited on the underlying epitaxial layer (or substrate) while being in-situ doped to a higher concentration by any known method for epitaxial layer growth. One example of epitaxial layers 110 includes a first epitaxial Si layer with a first concentration, a second epitaxial Si layer with a higher concentration, a third epitaxial Si layer with an even higher concentration, and a fourth epitaxial Si layer with the highest concentration.

Figure 2:
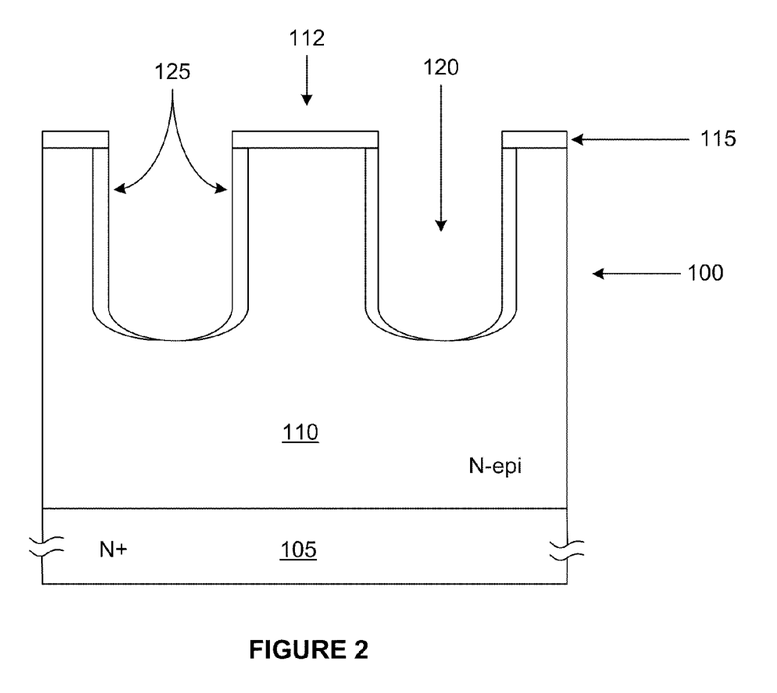
FIG. 2 depicts some embodiments of methods for making a semiconductor structure containing a trench structure formed in the epitaxial layer.

Next, a trench structure 120 can be formed in the epitaxial layer 110. The trench structure 120 can be formed by any known process. In some embodiments, a mask 115 can be formed on the upper surface of the epitaxial layer 110. The mask 115 can be formed by first depositing a layer of the desired mask material and then patterning it using photolithography and etch process so the desired pattern for the mask 115 is formed. The epitaxial layer 110 can then be etched by any known process until the trench 120 has reached the desired depth in the epitaxial layer 110. In some embodiments, the sidewall of the trench is not perpendicular to the upper surface of the epitaxial layer 110. Instead, the angle of the trench sidewall can range from about 90 degrees (a vertical sidewall) to about 70 degrees relative to the upper surface of the epitaxial layer 110. After the etching process used to create the trench is complete, a mesa structure 112 has been formed between adjacent trenches.

Next, the sidewall of the trench structure 120 can doped with a p-type dopant so that a sidewall dopant region 125 is formed on the trench sidewall. The sidewall doping process can be performed using any doping process which implants the p-type dopants to the desired width in the sidewall of the trench structure. After the doping process, the dopants can be further diffused into the mesa region by any known diffusion or drive-in process. The width of the sidewall dopant region can be adjusted so that the mesa region adjacent to any trench can be partially or fully depleted when the device is off and blocking the current. In some embodiments, the sidewall doping process can be performed using any angled implant process, the gas phase doping process, a diffusion process, or a combination thereof. In other embodiments, an angled implantation process can be used with an angle ranging from about 0 degrees (a vertical implant process) to about 45 degrees.

Figure 8:
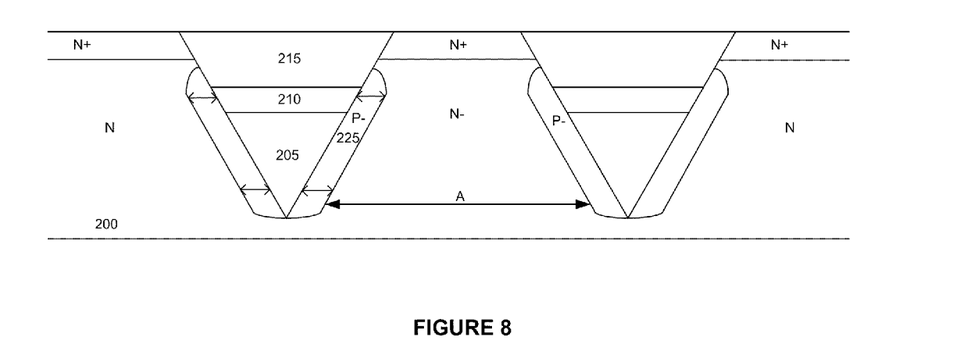
FIGS. 8 and 9 show some embodiments of the PN junctions that can be present in semiconductor structures.
Figure 9:
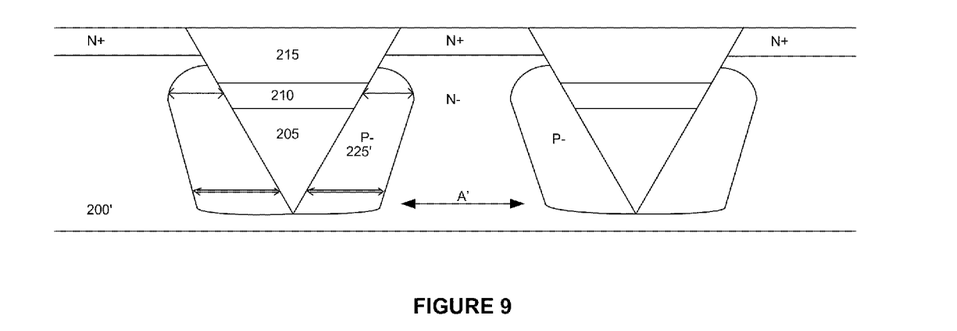

In some configurations, the width of the mesas 112, the depth of the trenches 120, the implantation angle, and the angle of the trench sidewall can be used to determine the width and depth of the p-type doped region of the side wall. Accordingly, the depth of the trenches can range from about 0.1 to about 100 µm and the width of the mesas can range from about 0.1 to about 100 µm when the angle of the trench sidewall can range from about 90 degrees (a vertical sidewall) to about 70 degrees.

Where the trench has a sidewall angle as described herein, the different dopant concentrations in the epitaxial layers 110 help form a PN super-junction structure with a well defined PN junction. With the sidewall angle, the width of the trench decreases slightly as the depth of the trench increases. When the angled implant process is performed on such a sidewall, the p-type sidewall dopant region created in the n-type epitaxial layer 110 will have a substantially similar angle. But the resulting structure at the PN junction contains an n-type region that is relatively larger than the p-type region, which can detract from the performance of the PN super-junction since it may not be charge balanced. By modifying the dopant concentration in the epitaxial layer 110 as described above and increasing the dopant concentration from the bottom to the top of the device, the angled implant process creates a substantially straighter PN junction rather than an angled PN junction, as shown in FIGS. 8 and 9. FIG. 8 illustrates a semiconductor structure containing p-regions 225, an angled trench 205, gate 210, insulating layer 215, and epitaxial layer 200 that contains a uniform dopant concentration. The p-regions 225 from one trench to another are separated by distance A in the N⁻ region of the epitaxial layer. The distance A, however, is wider than is needed for proper charge balance and depletion. On the other hand, the semiconductor structure depicted in FIG. 9 contains a similar structure, but the epitaxial layer 200' contains the gradient dopant concentration described herein. This gradient concentration allows the formation and adjustment of a p-region 225' that has a wider bottom, making the distance A' between the p-regions 225' smaller than A. The result of this configuration allows a more change-balanced semiconductor structure relative to the structure in FIG. 8.

Figure 3:
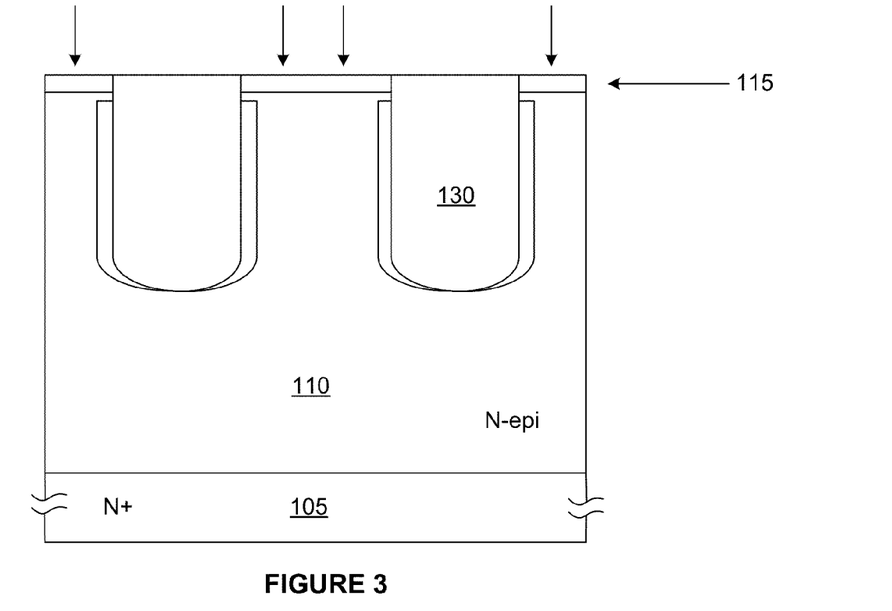
FIG. 3 shows some embodiments of methods for making a semiconductor structure with a first oxide region formed in the trench and a contact region formed in an upper surface of the epitaxial layer.

Next, as shown in FIG. 3, an oxide layer 130 (or other insulating or semi-insulating material) can be formed in the trenches 120. The oxide layer 130 can be formed by any process known in the art. In some embodiments, the oxide layer 130 can be formed by depositing an oxide material until it overflows the trenches 120. The deposition of the oxide material can be carried out using any known deposition process, including chemical vapor deposition (CVD) processes, such as SACVD. The thickness of the oxide layer 130 can be adjusted to any thickness needed to fill the trenches 120. If needed, a reflow process can be used to reflow the oxide material, which will help reduce voids or defects within the oxide region. After the oxide layer has been deposited, an etchback process can be used to remove the excess oxide material that located is above the trenches 120 and on the mesas 112. After the etchback process, the upper surface of the oxide layer 120 and the mask 115 are substantially coplanar, as depicted in FIG. 3. A planarization process, such as any chemical and/or mechanical polishing known in the art, can be used in addition to (whether before or after) or instead of the etchback process.

Optionally, a high quality oxide layer can be formed prior to depositing the oxide layer 130. In these embodiments, the high quality oxide layer can be formed by oxidizing the epitaxial layer 110 in an oxide-containing atmosphere until the desired thickness of the layer has been grown. The high quality oxide layer can be used to improve the oxide integrity and filling factor, thereby making the oxide layer 130 a better insulator.

Then, the mask 115 is removed from the upper surface of the epitaxial layer 110 using any process known in the art. Next, a contact region 135 can be formed on the exposed upper surface of the epitaxial layer 110 (which is exposed when the mask 115 is removed). The contact region 135 can be formed using any process known in the art. In some embodiments, the contact regions 135 can be formed by implanting an n-type dopant in the upper surface of the epitaxial layer 110 and then driving-in the dopant using any known process.

Once the contact regions 135 have been formed, an upper portion of the oxide layer 130 in the trench can be removed. The removal process can be performed using any process known in the art, including an etchback process using a plasma etch process. After the upper portion of the oxide layer 130 has been removed, the resulting structure is depicted in FIG. 4 where an upper part of the trench 120 does not contain an oxide material, but a first (or lower) oxide (or insulating) region 140 is formed in the bottom of the trenches 120.

Subsequently, a conductive layer can be deposited on the first oxide region 140 in the lower, middle, or upper part of the trench 120. The conductive layer can comprise any conductive and/or semiconductive material known in the art including any metal, silicide, semiconducting material, doped polysilicon, or combinations thereof. The conductive layer can be deposited by any known deposition process, including chemical vapor deposition processes (CVD, PECVD, LPCVD) or sputtering processes using the desired metal as the sputtering target.

The conductive layer can be deposited so that it fills the upper part of the trench 120 and overflows onto the upper part of the contact region 135. Then, a gate 150 can be formed from the conductive layer using any process known in the art. In some embodiments, the gate 150 can be formed by removing the upper portion of the conductive layer using any process known the art, including any etchback process. The result of the removal process leaves a conductive layer (the gate 150) overlying the first oxide region 140 in the trench 120, as shown in FIG. 4.

Figure 4:
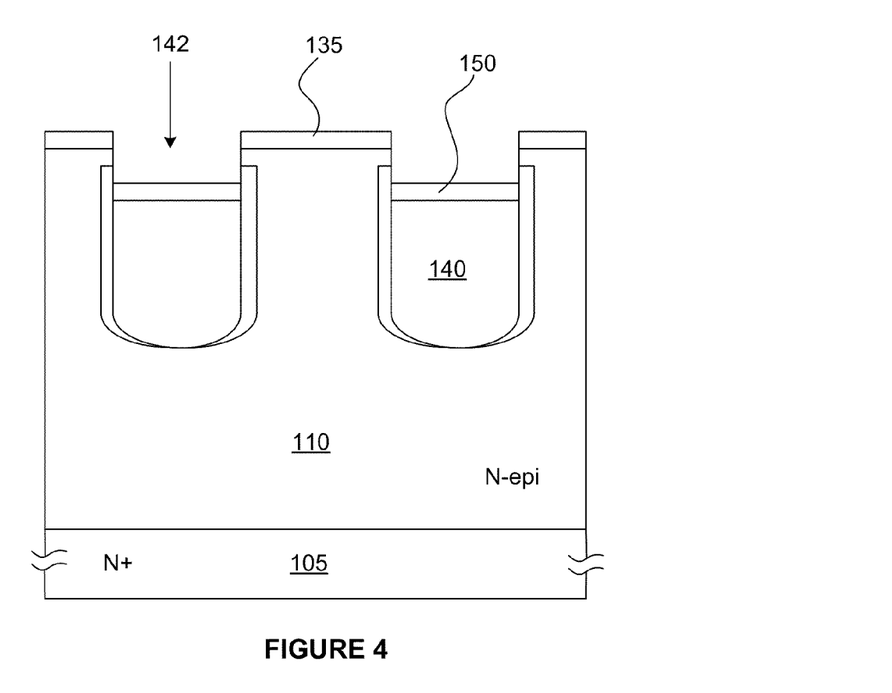
FIG. 4 depicts some embodiments of methods for making a semiconductor structure with a gate formed in the trench.
Figure 5:
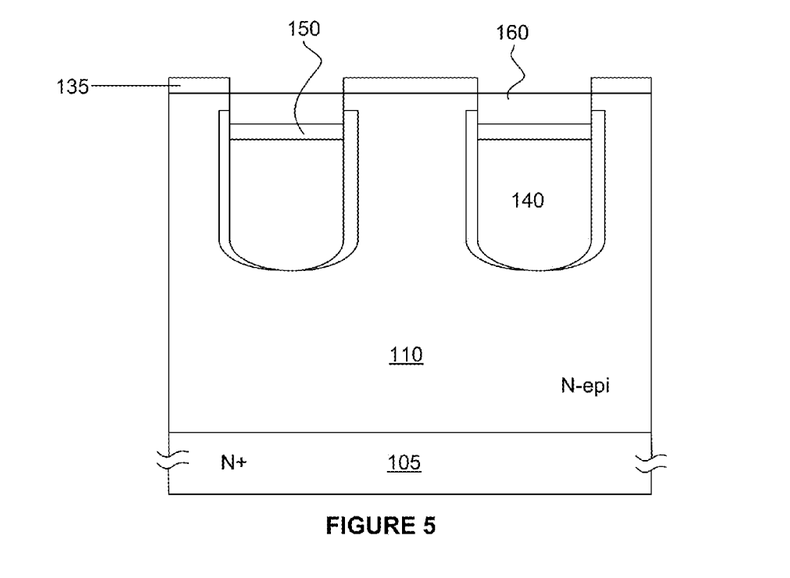
FIG. 5 shows some embodiments of methods for making semiconductor structure with a second oxide region formed over the gate in the trench.

Next, a second oxide layer (or second insulating or semi-insulating layer) can be deposited in the upper part of the trench 120 where the conductive layer has been removed (area 142 in FIG. 4). The second oxide layer can be formed by any process known in the art. In some embodiments, the second oxide layer is formed by depositing an oxide material until it overflows the upper part 142 of the trenches 120. The deposition of the oxide material can be carried out using any known deposition process, including chemical vapor deposition (CVD) processes such as SACVD. The thickness of the second oxide layer can be adjusted to the thickness needed fill the upper part 142 of the trench 120. If needed, a reflow process can be used to reflow the oxide material in the second oxide layer. After the second oxide layer has been deposited, an etchback process can be used to remove the amount of the material that is above the contact region 135 and above the trench 120.

Figure 6:
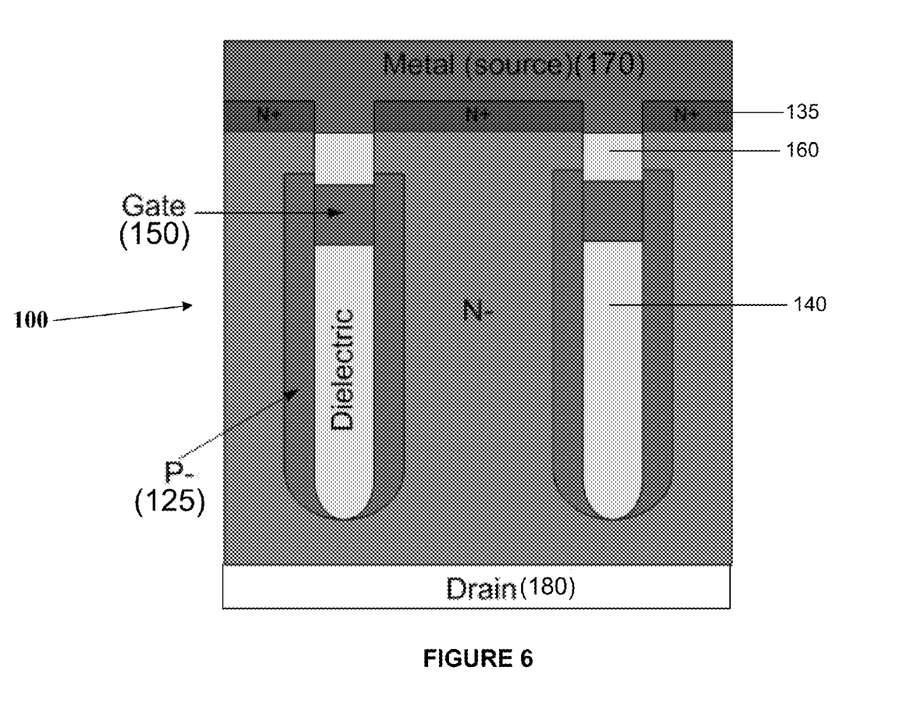
FIG. 6 shows some embodiments of methods for making a semiconductor structure with a source formed over the second oxide region and the contact region.

Next, as shown in FIG. 6, a source layer (or region) 170 can be deposited over the upper portions of the second oxide region 160 and the contact region 135. The source layer 170 can comprise any conductive and/or semiconductive material known in the art, including any metal, silicide, polysilicon, or combinations thereof. The source layer 170 can be deposited by any known deposition process, including chemical vapor deposition processes (CVD, PECVD, LPCVD) or sputtering processes using the desired metal as the sputtering target.

After (or before) the source layer 170 has been formed, a drain 180 can be formed on the backside of the substrate 105 using any process known in the art. In some embodiments, the drain 180 can be formed on the backside by thinning the backside of the substrate 105 using any process known in the art, including a grinding, polishing, or etch processes. Then, a conductive layer can be deposited on the backside of the substrate 105 as known in the art until the desired thickness of the conductive layer of the drain is formed.

These methods of manufacturing have several useful features. Using these methods, it can be easier to implement a metal gate since there is no high temperature process required after the gate deposition. As well, the super-junction structure can be made at a lower cost compared to conventional process such as selective epitaxial growth.

An example of the semiconductor devices 100 resulting from these methods is depicted in FIG. 6. In FIG. 6, the semiconductor device 100 contains a source layer 170 that is located in an upper portion of the device 100 and a drain 180 located in the bottom portion of the device. The gate 150 is vertically isolated between the first oxide region 140 and the second oxide region 160. At the same time, the gate 150 is connected to the p-type sidewall dopant regions 125 which, along with the n-type epitaxial layer 110, form the PN junction of a super-junction structure. With such a configuration, the gate can be used to control the current path in the semiconductor device 100.

Figure 7:
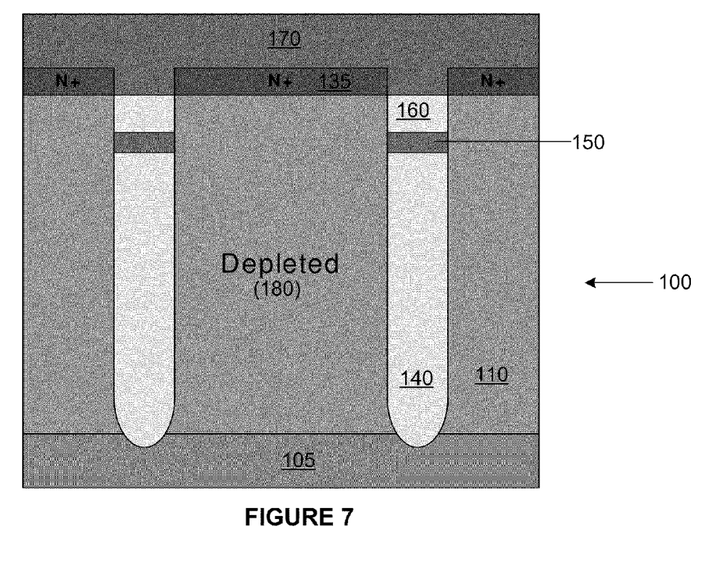
FIG. 7 shows some embodiments of the operation of the semiconductor structure depicted in FIG. 6.

The operation of the semiconductor device 100 is similar to these two SIT devices. For example, like a SIT device, the semiconductor device operates normally in an off-state with the gate voltage equal to 0. But when a reverse bias is applied to the gate, the depletion region 180 can expand and pinch off the drift region, as shown in FIG. 7.

The semiconductor device 100 also improves on the device characteristics of both planar SIT and recessed gate SIT devices. As mentioned above, planar gate SIT devices (as shown in FIG. 8*a*) can have relatively low capacitance but a high $R_{sp}$ while recessed gate SIT devices can have low $R_{sp}$ but a high capacitance. The first improvement of the device 100 over these SIT devices is that the $R_{sp}$ of the semiconductor device 100 depicted in FIG. 6 can be significantly lower than the planar gate SIT devices. This improvement results from the higher doping concentration in the channel and drift regions that can be achieved by first, charge balancing with the trench super-junction and second, by the methods for defining the smaller features and controlling the diffusion in the sidewall implant process. The second improvement is that the capacitance of the semiconductor device 100 can be significantly lower than the recessed gate SIT devices because the parasitic capacitance from the gate connection from the surface can be virtually removed.

A third improvement over these SIT devices relates to the die size. Given that different die sizes are often needed to achieve an equivalent $Rds_{on}$ for a semiconductor device, the actual capacitance of the semiconductor device 100 for a given die size is much smaller than both of these SIT devices.

A fourth improvement over these SIT devices relates to the parasitic capacitance. Since the gate of the semiconductor device 100 is isolated by using the first oxide region 140 and second oxide region 160 in the trench 120, the parasitic capacitance can be reduced relative to recessed gate SIT devices since the recessed gate SIT has large parasitic capacitance from the sidewall insulation and the gate connection material.

A fifth improvement relates to the drift region of the device. For both of the SIT structures described above, to deplete the entire drift region, the drift region doping concentration should be as low as possible to achieve high breakdown voltage. But this often results in relatively high on-resistance. But combining the SIT (or JFET) structures in a trench with a super-junction structure can increase the drift doping concentration and can also define a smaller pitch that is able to improve both the current conductivity and the frequency (the switching speed). And due to the super-junction created made by junction of the P trench sidewall and the N epitaxial layer, the drift region doping concentration can be much higher than the conventional SIT or JFET structure.

It is understood that all material types provided herein are for illustrative purposes only. Accordingly, one or more of the various dielectric layers in the embodiments described herein may comprise low-k or high-k dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

In some embodiments, a method for making a semiconductor device comprises providing a semiconductor substrate heavily doped with a dopant of a first conductivity type, providing an epitaxial layer on the substrate, the epitaxial layer being lightly doped with a dopant of a first conductivity type with a concentration gradient, providing a trench formed in the epitaxial layer, the trench containing a sidewall that is lightly doped with a dopant of a second conductivity type, a first insulating region in a lower portion of the trench and a second insulating region in an upper portion of the trench, the first and second insulating regions sandwiching a conductive layer, providing a source layer contacting the upper surface of the epitaxial layer and the upper surface of the second insulating region, and providing a drain contacting a bottom portion of the substrate.

In some embodiments, a method for making a semiconductor device comprises providing a semiconductor substrate heavily doped with a dopant of a first conductivity type, providing an epitaxial layer on the substrate, the epitaxial layer being lightly doped with a dopant of a first conductivity type with a concentration gradient, providing a contact region on the upper surface of the epitaxial layer, the contact region being heavily doped with a dopant of a first conductivity type, providing a trench formed in the epitaxial layer, the trench containing a sidewall that is lightly doped with a dopant of a second conductivity type to form a super-junction with the epitaxial layer, and the trench containing a gate electrically connected to the sidewall and insulated by upper and lower insulating regions in the trench, providing a source layer contacting the upper surface of the epitaxial layer and the upper surface of the upper insulating region, and providing a drain contacting a bottom portion of the substrate.

In some embodiments, a method for making a semiconductor device comprises providing a semiconductor substrate heavily doped with a dopant of a first conductivity type, depositing an epitaxial layer on the substrate, the epitaxial layer being lightly doped with a dopant of a first conductivity type and containing a decreasing dopant concentration as it approaches the substrate, forming a trench in the epitaxial layer, the trench containing a sidewall angle ranging from about 90 (vertical side wall) to about 70 degrees, forming a dopant region in the trench sidewall using an angled implantation process, the dopant region being lightly doped with a dopant of a second conductivity type, forming a first insulating region in a lower portion of the trench, forming a contact region on the upper surface of the epitaxial layer, the contact region being heavily doped with a dopant of a first conductivity type, forming a conductive gate on the first insulating region, forming a second insulating region on the conductive gate, depositing a source on the upper surface of the epitaxial layer and the upper surface of the second insulating region, and forming a drain on a bottom portion of the substrate.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor device, comprising:
   a semiconductor substrate heavily doped with a dopant of a first conductivity type;
   an epitaxial layer on the substrate, the epitaxial layer being lightly doped with a dopant of a first conductivity type with a concentration gradient;
   a trench formed in the epitaxial layer, the trench containing a sidewall that is lightly doped with a dopant of a second conductivity type, a first insulating region in a lower portion of the trench and a second insulating region in an upper portion of the trench, the first and second insulating regions sandwiching a conductive or semiconductive layer;
   a source layer contacting the upper surface of the epitaxial layer and the upper surface of the second insulating region; and
   a drain contacting a bottom portion of the substrate.

2. The device of claim 1, wherein the first conductivity type dopant is an n-type dopant and the second conductivity type dopant is a p-type dopant.

3. The device of claim 1, wherein the first conductivity type dopant is a p-type dopant and the second conductivity type dopant is a n-type dopant.

4. The device of claim 1, wherein the concentration gradient of the epitaxial layer has a higher concentration at an upper surface and a lower concentration near the substrate.

5. The device of claim 4, wherein the concentration gradient decreases from the upper surface to the substrate in a substantially uniform or substantially step-wise manner.

6. The device of claim 1, wherein the first and second insulating regions comprise a deposited oxide or nitride material.

7. The device of claim 1, wherein the trench comprises a sidewall with an angle range from about 90 to about 70 degrees.

8. The device of claim 1, wherein the trench sidewall dopant has been implanted at an angle ranging from more than 0 to about 40 degrees.

9. The device of claim 1, wherein the trench extends into the substrate.

10. A semiconductor device, comprising:
   a semiconductor substrate heavily doped with a dopant of a first conductivity type;
   an epitaxial layer on the substrate, the epitaxial layer being lightly doped with a dopant of a first conductivity type with a concentration gradient;
   a contact region on the upper surface of the epitaxial layer, the contact region being heavily doped with a dopant of a first conductivity type;
   a trench formed in the epitaxial layer, the trench containing a sidewall that is lightly doped with a dopant of a second conductivity type to form a super junction with the epitaxial layer, and the trench containing a gate electrically connected to the sidewall and insulated by upper and lower insulating regions in the trench;
   a source layer contacting the upper surface of the epitaxial layer and the upper surface of the upper insulating region; and
   a drain contacting a bottom portion of the substrate.

11. The device of claim 10, wherein the first conductivity type dopant is a p-type dopant and the second conductivity type dopant is a n-type dopant.

12. The device of claim 10, wherein the first conductivity type dopant is a n-type dopant and the second conductivity type dopant is a p-type dopant.

13. The device of claim 10, wherein the concentration gradient of the epitaxial layer has a higher concentration at an upper surface and a lower concentration near the substrate.

14. The device of claim 13, wherein the concentration gradient decreases from the upper surface to the substrate in a substantially uniform or substantially step-wise manner.

15. The device of claim 10, wherein the first and second insulating regions comprise a deposited oxide material.

16. The device of claim 10, wherein the trench comprises a sidewall with an angle range from about 90 to about 70 degrees.

17. The device of claim 1, wherein the trench sidewall dopant has been implanted at an angle ranging from more than 0 to about 40 degrees.

18. An electronic apparatus containing a semiconductor device, comprising:
   a semiconductor substrate heavily doped with a dopant of a first conductivity type;
   an epitaxial layer on the substrate, the epitaxial layer being lightly doped with a dopant of a first conductivity type with a concentration gradient;
   a trench formed in the epitaxial layer, the trench containing a sidewall that is lightly doped with a dopant of a second conductivity type, a first insulating region in a lower portion of the trench and a second insulating region in an upper portion of the trench, the first and second insulating regions sandwiching a conductive layer;
   a source layer contacting the upper surface of the epitaxial layer and the upper surface of the second insulating region; and
   a drain contacting a bottom portion of the substrate.

19. The apparatus of claim 18, wherein the concentration gradient of the epitaxial layer has a higher concentration at an upper surface and a lower concentration near the substrate.

20. The apparatus of claim 19, wherein the concentration gradient decreases from the upper surface to the substrate in a substantially uniform or substantially step-wise manner.

* * * * *